United States Patent
Bateman et al.

(10) Patent No.: US 8,697,559 B2
(45) Date of Patent: Apr. 15, 2014

(54) USE OF ION BEAM TAILS TO MANUFACTURE A WORKPIECE

(75) Inventors: Nicholas P. T. Bateman, Reading, MA (US); Peter L. Kurunczi, Cambridge, MA (US); Benjamin B. Riordon, Newburyport, MA (US); John W. Graff, Swampscott, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 228 days.

(21) Appl. No.: 13/178,118

(22) Filed: Jul. 7, 2011

(65) Prior Publication Data

US 2013/0008494 A1    Jan. 10, 2013

(51) Int. Cl.
*H01L 21/22* (2006.01)
*H01L 21/38* (2006.01)

(52) U.S. Cl.
USPC ............ 438/545; 438/57; 438/96; 438/514; 438/527; 257/E25.007

(58) Field of Classification Search
USPC ....... 438/57, 96, 514, 527, 545; 257/E25.007
See application file for complete search history.

(56) References Cited

U.S. PATENT DOCUMENTS

| | | | |
|---|---|---|---|
| 6,333,457 B1 * | 12/2001 | Mulligan et al. | 136/255 |
| 7,727,866 B2 | 6/2010 | Bateman et al. | |
| 7,776,727 B2 | 8/2010 | Borden | |
| 7,820,460 B2 | 10/2010 | Sullivan et al. | |
| 2009/0029535 A1 | 1/2009 | Okai | |
| 2009/0227095 A1 | 9/2009 | Bateman et al. | |
| 2009/0308439 A1 | 12/2009 | Adibi et al. | |
| 2009/0308440 A1 | 12/2009 | Adibi et al. | |
| 2010/0323508 A1 | 12/2010 | Adibi et al. | |
| 2011/0023956 A1 | 2/2011 | Harder | |
| 2011/0237022 A1 | 9/2011 | Bateman et al. | |

FOREIGN PATENT DOCUMENTS

| | | |
|---|---|---|
| WO | 2009033134 A2 | 3/2009 |
| WO | 2010108151 A1 | 9/2010 |
| WO | 2011070156 A2 | 6/2011 |

OTHER PUBLICATIONS

Nishihashi, T., et al. Ion-graphy Implanter with Stencil Mask, Journal of Vacuum Science and Technology: Part B, May 1, 2002, pp. 914-917, vol. 20, No. 3, American Vacuum Society, Melville New York, USA.

Sinton & Swanson, Simplified Backside-Contact Solar Cells, IEEE Transactions on Electron Devices, Feb. 1990, pp. 348-352, vol. 37, No. 2, IEEE.

* cited by examiner

*Primary Examiner* — Michelle Mandala

(57) ABSTRACT

One method of implanting a workpiece involves implanting the workpiece with an n-type dopant in a first region with center and a periphery. The workpiece also is implanted with a p-type dopant in a second region complementary to the first region. This second region also has a center and a periphery. The periphery of the first region and the periphery of the second region at least partially overlap. A dose at the periphery of the first region or second region is less than a dose at the center of the first region or second region. The region of overlap may function as a junction where charge carriers cannot pass.

8 Claims, 7 Drawing Sheets

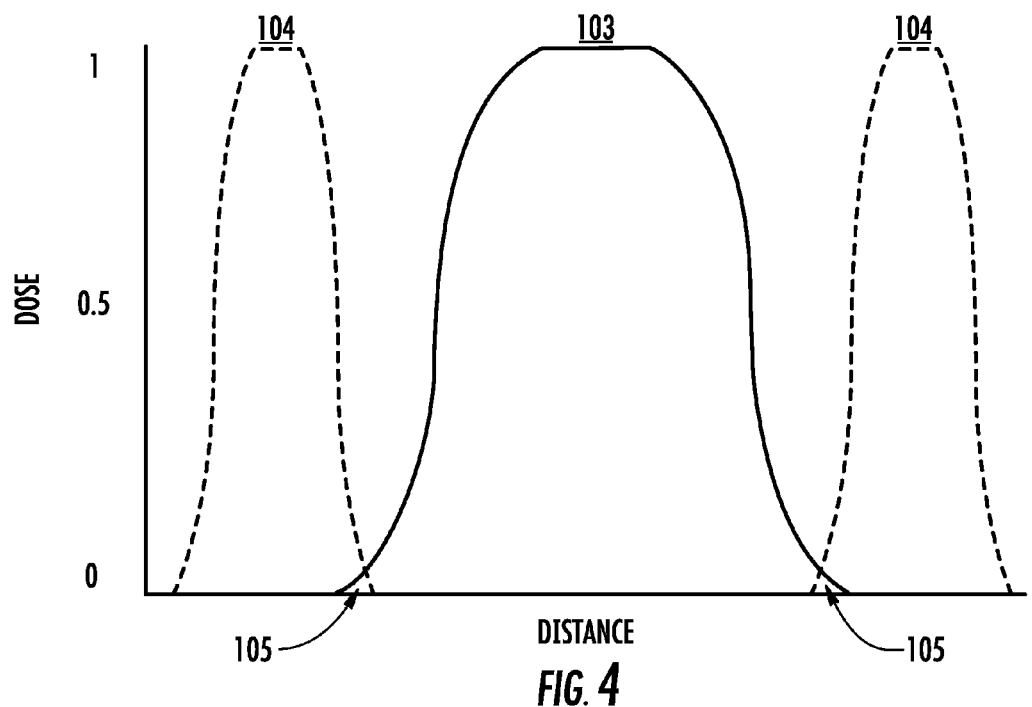

USE OF ION BEAM TAILS TO MANUFACTURE A WORKPIECE

FIELD

This invention relates to ion implantation and, more particularly, to ion implantation of solar cells.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the ion beam penetrate into the bulk of the workpiece material and are embedded into the crystalline lattice of the workpiece material to form a region of desired conductivity.

Solar cells are one example of a device that uses silicon workpieces. Any reduced cost to the production of high-performance solar cells or any efficiency improvement to high-performance solar cells would have a positive impact on the implementation of solar cells worldwide. This will enable the wider availability of a clean energy technology.

Solar cells typically consist of a p-n semiconducting junction. FIG. 1 is a cross-sectional view of an interdigitated back contact (IBC) solar cell. In the IBC solar cell 205, the junction is on the back or non-illuminated surface. In this particular embodiment, the IBC solar cell 205 has an n-type base 206, an n+ front surface field 207, a passivating layer 208, and an anti-reflective coating (ARC) 209. The passivating layer 208 may be $SiO_2$ and the ARC 209 may be $SiN_x$ in one instance, though other materials or dielectrics may be used. Photons 214 enter the IBC solar cell 205 through the top (or illuminated) surface, as signified by the arrows. These photons 214 pass through the ARC 209, which is designed to minimize the number of photons 214 that are reflected away from the IBC solar cell 205. The photons 214 enter through the n+ front surface field 207. The photons 214 with sufficient energy (above the bandgap of the semiconductor) are able to promote an electron within the valence band of the semiconductor material to the conduction band. Associated with this free electron is a corresponding positively charged hole in the valence band.

On the back side of the IBC solar cell 205 is an emitter region 215. The doping pattern of the emitter region 215 is alternating p-type and n-type dopant regions in this particular embodiment. The n+ back surface field 204 may be approximately 450 μm in width and doped with phosphorus or other n-type dopants. The p+ emitter 203 may be approximately 1450 μm in width and doped with boron or other p-type dopants. This doping may enable the junction in the IBC solar cell 205 to function or have increased efficiency. This IBC solar cell 205 also includes a passivating layer 212, n-type contact fingers 210, p-type contact fingers 211, and contact holes 213 through the passivating layer 212.

To form the IBC solar cell 205, at least two patterned doping steps may be required. If the p+ emitter 203 and n+ back surface field 204 overlap after these patterned doping steps and the overlap region has high dopant concentrations for both n-type and p-type dopants, there will be a very narrow depletion region between the p+ emitter 203 and n+ back surface field 204. This means that shunting between the p+ emitter 203 and n+ back surface field 204 can occur. High dopant concentrations between $1E18\ cm^2$ to $1E19\ cm^{-2}$ or around the mid $E19\ cm^{-2}$ may lead to shunting.

To avoid such shunting, tight alignment of the p+ emitter 203 and n+ back surface field 204 is required so that no such overlap occurs. However, even if no overlap occurs, if the p+ emitter 203 and the n+ back surface field 204 touch then charge carriers can cross between the p+ emitter 203 and the n+ back surface field 204 using quantum tunneling. In such a case, the space charge region between the emitter 203 and the n+ back surface field 204 will be shallow, enabling the quantum tunneling. Since the p+ emitter 203 and the n+ back surface field 204 are located on the same side of the IBC solar cell 205 in the emitter region 215, such quantum tunneling also can shunt any junction between the p+ emitter 203 and the n+ back surface field 204.

The IBC solar cell 205 may be improved by increasing the distance between the p+ emitter 203 and the n+ back surface field 204 to, for example, approximately 1 μm. However, maintaining alignment of the two patterned doping steps to keep such a distance while ensuring the p+ emitter 203 and the n+ back surface field 204 are not close enough for quantum tunneling is difficult. Increasing this distance between the p+ emitter 203 and the n+ back surface field 204 to larger dimensions also has problems. If large undoped regions exist between the p+ emitter 203 and the n+ back surface field 204, then charge carriers will not be repelled from the surface of the IBC solar cell 205. Unless this surface is well-passivated, recombination can occur at the surface of this undoped region. Recombination degrades voltage and current of the IBC solar cell 205. Therefore, there is a need in the art for an improved method of doping solar cells and, more particularly, an improved method of doping IBC solar cells using ion implantation.

SUMMARY

According to a first aspect of the invention, a method of implanting a workpiece is provided. The method comprises implanting the workpiece with an n-type dopant in a first region. This first region has a center and a periphery. The workpiece is implanted with a p-type dopant in a second region complementary to the first region. This second region has a center and a periphery. The periphery of the first region and the periphery of the second region at least partially overlap. A dose at the periphery of the first region is less than a dose at the center of the first region and a dose at the to periphery of the second region is less than a dose at the center of the second region.

According to a second aspect of the invention, a method of implanting a workpiece is provided. The method comprises implanting an entire surface of the workpiece with a first dopant. The workpiece is implanted with a second dopant in a second region that is a fraction of the surface. The second region has a center and a periphery and has a larger dose at the center than at the periphery.

According to a third aspect of the invention, a solar cell is provided. The solar cell comprises a workpiece having a first surface. A plurality of n-type regions are in the first surface. Each of the n-type regions has a center and a periphery. The center of the n-type region has a dose larger than in the periphery of the n-type region. A plurality of p-type regions are in the first surface complementary to the plurality of the n-type regions. Each of the p-type regions has a center and a periphery. The center of the p-type region has a dose larger than in the periphery of the p-type region. The periphery of the p-type region and the periphery of the n-type region at least partially overlap.

According to a fourth aspect of the invention, a solar cell is provided. The solar cell comprises a workpiece having a first surface. This first surface is doped to a first conductivity to a first depth. A plurality of second regions are in the first surface. Each of the second regions is doped to a second conductivity opposite the first conductivity and each of the second regions has a center and a periphery. The center of the second region has a dose larger than in the periphery of the second region. A space charge region is between the plurality of the second regions.

BRIEF DESCRIPTION OF THE DRAWINGS

For a better understanding of the present disclosure, reference is made to the accompanying drawings, which are incorporated herein by reference and in which:

FIG. 4 is a diagram illustrating a third embodiment of a close profile.

DETAILED DESCRIPTION

The embodiments of this method are described herein in connection with an ion implanter. Beamline ion implanters, plasma doping ion implanters, focused plasma systems, systems that modulate a plasma sheath, or flood ion implanters may be used. However, gaseous diffusion, furnace diffusion, laser doping, other plasma processing tools, or other methods known to those skilled in the art also may be used for the blanket or selective implant or doping steps. While specific n-type and p-type dopants are listed, other n-type or p-type dopants may be used instead and the embodiments herein are not limited solely to the dopants listed. Furthermore, while one particular embodiment of a solar cell is specifically listed, embodiments of this process may be applied to other solar cell designs or even other workpieces such as semiconductor wafers, light-emitting diodes (LEDs), or flat panels. And while referred to as first or second, the steps in the embodiments disclosed herein may occur in any order and are not limited to the exact sequence listed. This nomenclature is for explanation only. Thus, the invention is not limited to the specific embodiments described below.

Figure 2:
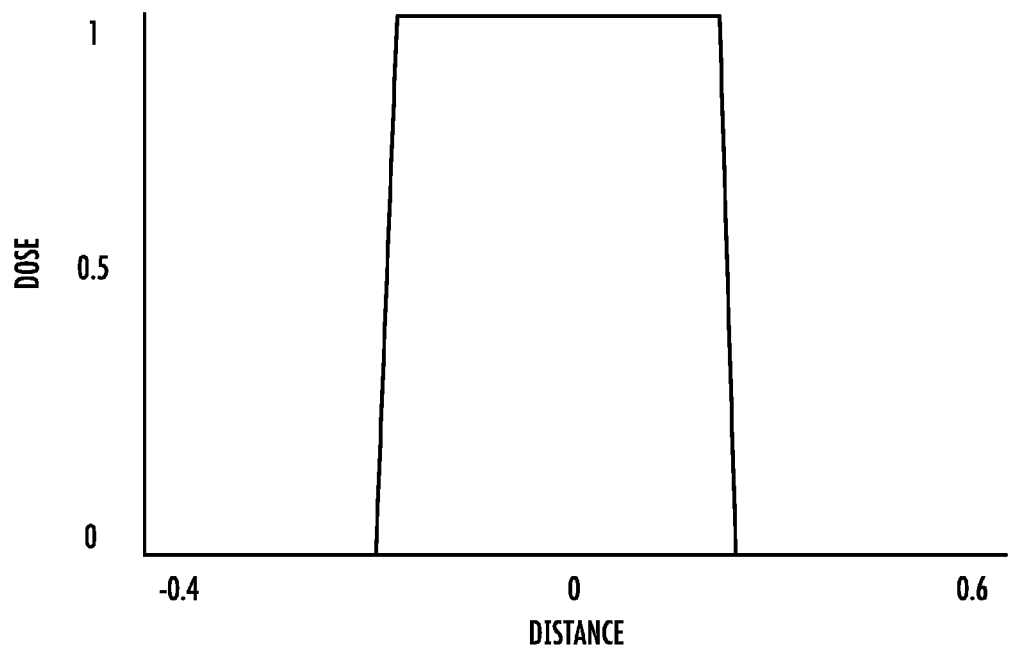
FIG. 2 is a diagram illustrating a first embodiment of a dose profile.

FIG. 2 is a diagram illustrating a first embodiment of a dose profile. A perfectly parallel ion beam that is implanted through a shadow mask or stencil mask will produce an implanted region in a workpiece with an abrupt transition between implanted and unimplanted regions. This shadow mask or stencil mask may sit on the workpiece or be disposed upstream of the workpiece. FIG. 2 illustrates such a dose profile in the workpiece after implantation with a perfectly parallel ion beam that has very sharp or distinct edges of regions that have been implanted.

Figure 3:
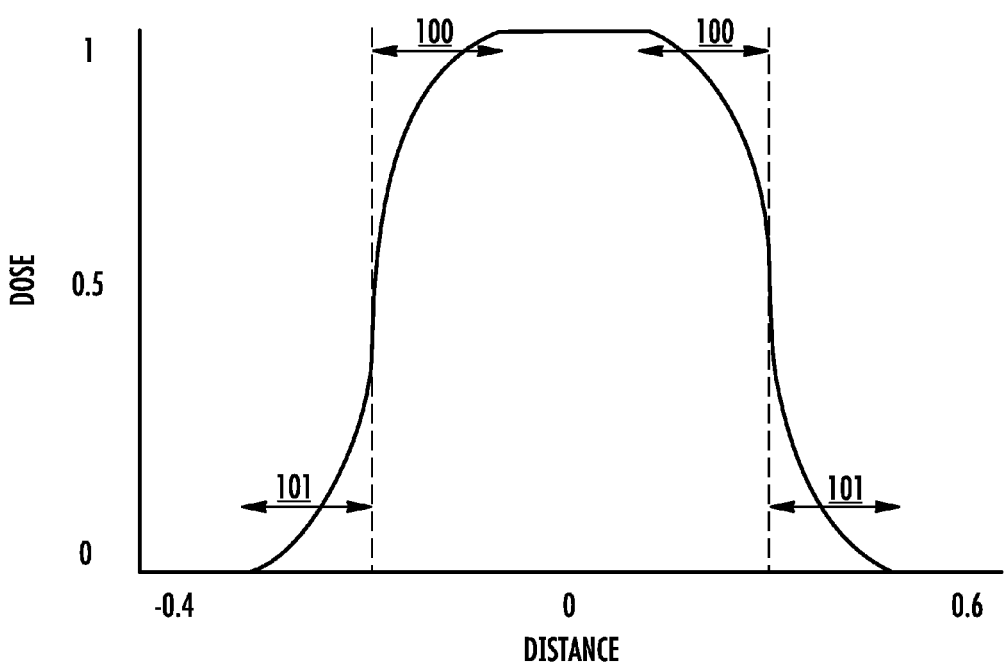
FIG. 3 is a diagram illustrating a second embodiment of a dose profile.

FIG. 3 is a diagram illustrating a second embodiment of a dose profile. Any ion beam has an inherent spread of angles, such as those due to space charge effect or ion beam "blow up." This spread of angles means the transition between the implanted and unimplanted regions will not be perfectly abrupt as seen in FIG. 2. Instead, the transition in FIG. 3 reflects the distribution of angles and the geometry of the shadow mask or stencil mask and the workpiece. Thus, shoulders 100 and tails 101 are formed in the dose profile. If the distance between the back of the shadow or stencil mask and the workpiece is reduced, then the tails 101 will shrink. If the distance between the front of the shadow or stencil mask and the workpiece is reduced, then the shoulders 100 will shrink. Both will make the dose profile of FIG. 3 resemble the dose profile of FIG. 2 more closely.

The spread of angles of the ion beam and geometry of the shadow or stencil mask and the workpiece can be used to produce a tail 101 that enables light doping of the gap between n-type regions and p-type regions of a workpiece. This may be applied to solar cells, such as the IBC solar cell 205 of FIG. 1.

FIG. 4 is a diagram illustrating a third embodiment of a dose profile. In this embodiment, a region 103 is of a first conductivity and the regions 104 (represented by the dotted lines) are of a second conductivity. These conductivities may be opposite and can represent n-type and p-type doped regions. There also are regions 105 where the region 103 and region 104 overlap. These regions 105 can serve as a junction where charge carriers cannot pass. The junction will occur where equal amounts of dopant of the first conductivity and second conductivity are present. The tails of the ion beams are used lightly dope the regions 105 between the region 103 and regions 104. In a solar cell, such as the IBC solar cell 205, this light doping provides an electric field that inhibits charge carriers from moving to the surface and recombining. The doping level can be configured to be low enough to prevent or reduce quantum tunneling.

Figure 5A:
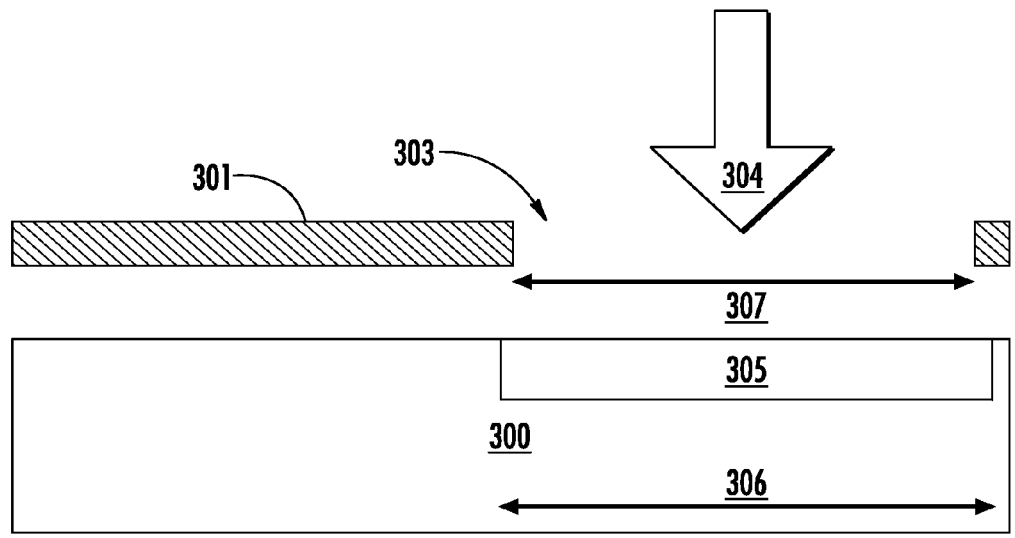
FIGS. 5A-B are cross-sectional side views of a first embodiment of implanting a workpiece.
Figure 5B:
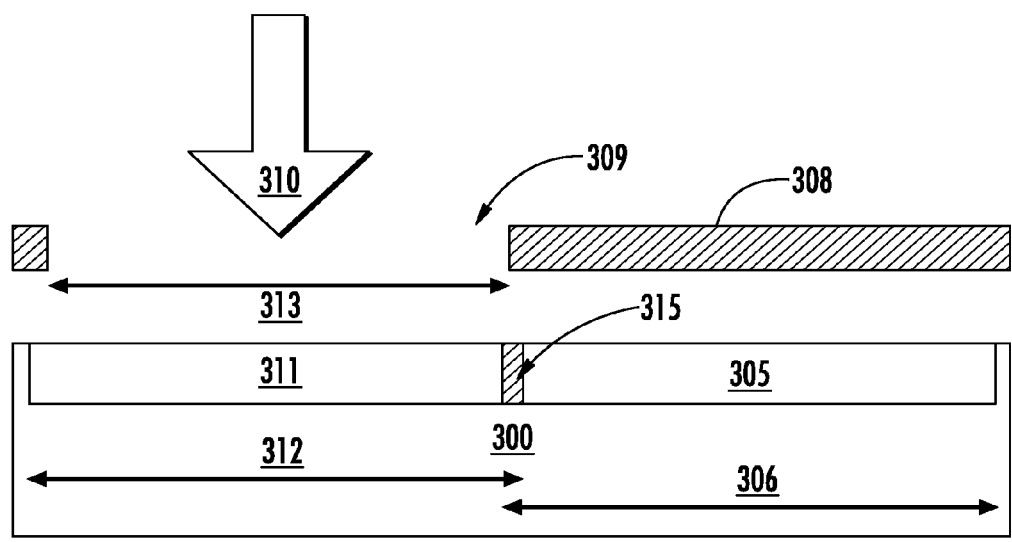

FIGS. 5A-B are cross-sectional side views of a first embodiment of implanting a workpiece. In FIG. 5A, the workpiece 300 is implanted with a first species 304. The workpiece 300 may be silicon and may be used to manufacture a solar cell. The first species 304 is implanted through the aperture 303 in the mask 301. This mask 301 may be a shadow mask or stencil mask and in this embodiment is illustrated upstream of the workpiece 300. The mask 301 blocks the first species 304 from implanting the workpiece 300 except through the aperture 303.

The first species 304 forms the first region 305 in the workpiece 300. The first region 305 has a center and a periphery at each end of the dimension 306. The dimension 306 of the first region 305 is slightly larger than the dimension 307 of the aperture 303. This is partly due to the space charge of the first species 304 in the ion beam.

In FIG. 5B, the workpiece 300 is implanted with a second species 310. The second species 310 is implanted through an aperture 309 in the mask 308. This mask 308 may be a shadow mask or stencil mask and in this embodiment is illustrated upstream of the workpiece 300. The mask 308 blocks the second species 310 from implanting the workpiece 300 except through the aperture 309. The first species 304 and second species 310 have opposite conductivities in one embodiment, such that one is n-type and the other is p-type.

The second species 310 forms the second region 311 in the workpiece 300. The second region 311 has a center and a periphery at each end of the dimension 312. The dimension 312 of the second region 311 is slightly larger than the dimension 313 of the aperture 309. This is partly due to the space charge of the second species 310 in the ion beam. The second region 311 and first region 305 in this embodiment are complementary or aligned with respect to one another.

The first region 305 and second region 311 both may have a dose gradient or profile such that each has a larger dose in the center than at the periphery. The periphery of the first region 305 and periphery of the second region 311 overlap in FIG. 5B. This overlap region 315, which is shaded in FIG. 5B, contains both n-type and p-type species. A junction is formed at the location where the concentrations of the n-type and p-type species are the same. A depletion region also is formed and the depth of this depletion region increases as the dopant concentration in the overlap region 315 decreases. When the junction is formed at a sufficiently low dopant concentration, the depletion region will be deep enough to prevent quantum tunneling of charge carriers.

Figure 1:
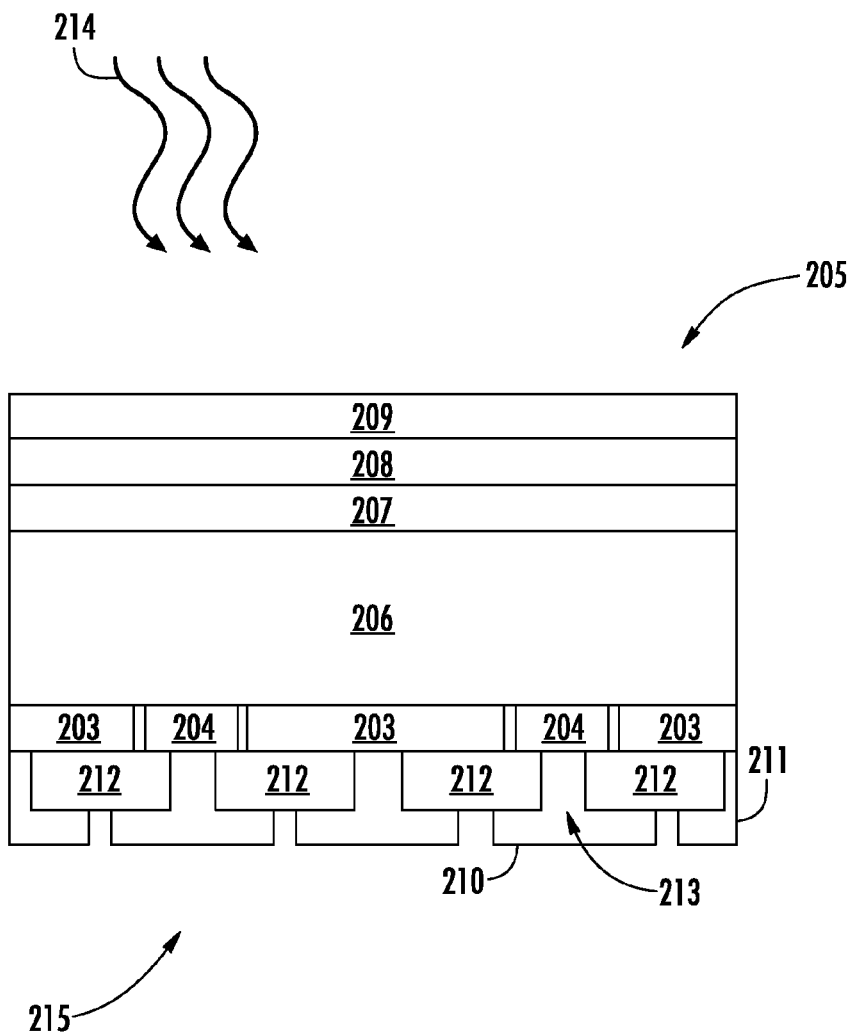
FIG. 1 is a cross-sectional view of an IBC solar cell.

In one instance the first region 305 and second region 311 of FIG. 5B may be the p+ emitter 203 and the n+ back surface field 204 of the IBC solar cell 205 of FIG. 1, though other designs or embodiments are possible. While only one first region 305 and one second region 311 are illustrated in FIG. 5B, multiple first regions 305 and second regions 311 may be used across a surface of the workpiece 300. Tails, such as those illustrated in FIG. 3, may be used or adjusted to form the junction or overlap region 315.

Figure 6A:
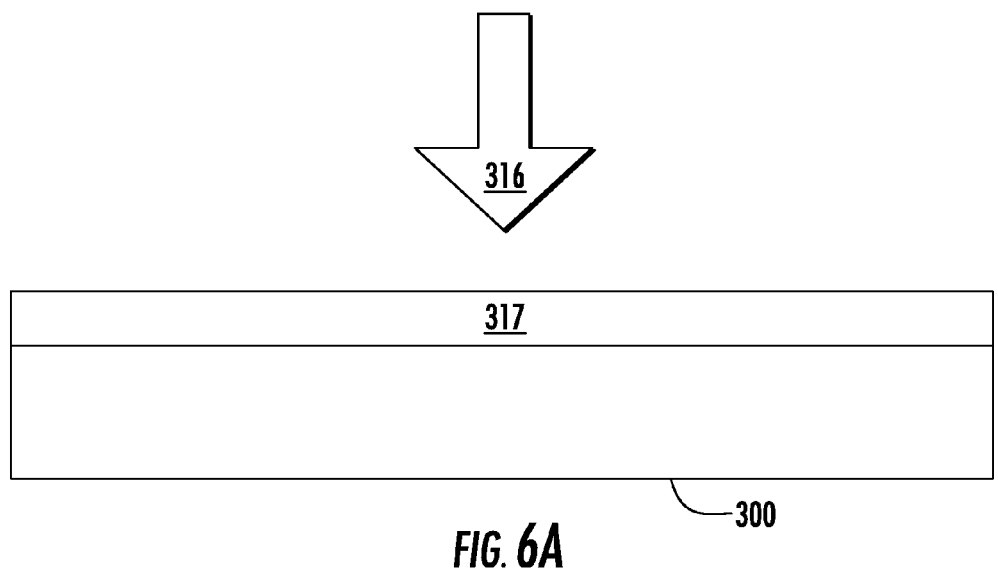
FIG. 6A-B are cross-sectional side views of a second embodiment of implanting a workpiece.
Figure 6B:
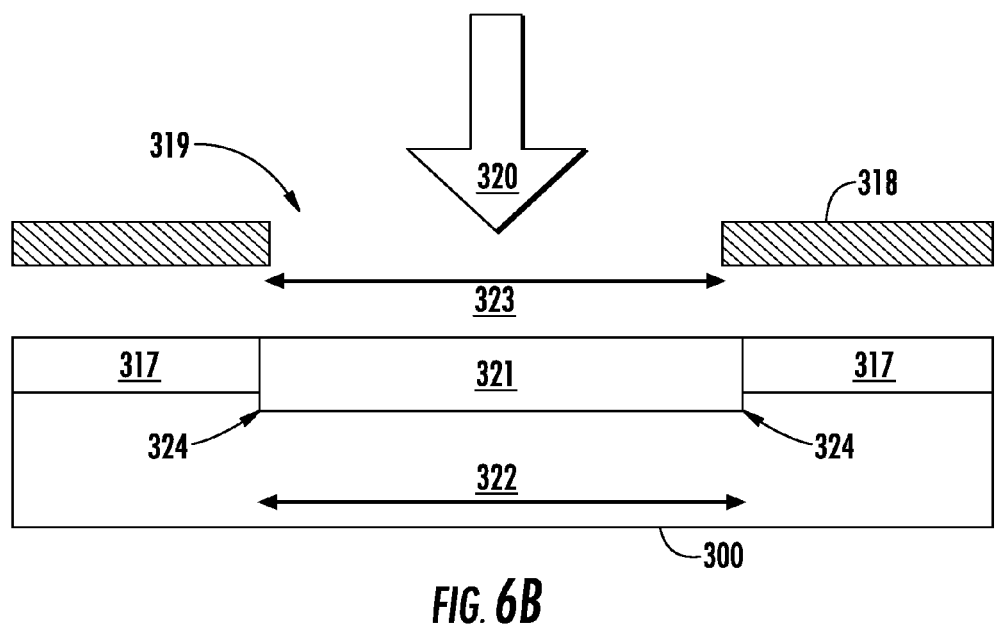

FIGS. 6A-B are cross-sectional side views of a second embodiment of implanting a workpiece. In FIG. 6A, the workpiece 300 is implanted with a first species 316. The workpiece 300 may be silicon and may be used to manufacture a solar cell. The first species 316 forms the first region 317 in the workpiece 300. The implant of the first species 316 may be a blanket implant of the entire surface of the workpiece 300 in one instance and may be uniform.

In FIG. 6B, the workpiece 300 is implanted with a second species 320. The second species 320 is implanted through an aperture 319 in the mask 318. This mask 318 may be a shadow mask or stencil mask and in this embodiment is illustrated upstream of the workpiece 300. The mask 318 blocks the second species 320 from implanting the workpiece 300 except through the aperture 319. The first species 316 and second species 320 have opposite conductivities in one embodiment, such that one is n-type and the other is p-type.

The second species 320 forms the second region 321 in the workpiece 300. The second region 321 is only a fraction of the surface of the workpiece 300 in this embodiment. The second region 321 has a center and a periphery at each end of the dimension 322. The dimension 322 of the second region 321 is slightly larger than the dimension 323 of the aperture 319. This is partly due to the space charge of the second species 320 in the ion beam. While the second region 321 is illustrated as implanted deeper than the first region 317, the second region 321 also may be shallower or approximately the same depth as the first region 317.

The second region 321 may have a dose gradient or profile such that it has a larger dose in the center than at the periphery. This larger dose of the second region 321 or within the second region 321 may be larger than the dose of the first region 317. Thus, counterdoping may occur. At each end of the periphery of the second region 321 is a space charge region 324. A dopant profile in the periphery of the second region 321 or first region 317 is configured to prevent shunting across this space charge region 324. In one instance the first region 317 and second region 321 of FIG. 6B may be the p+ emitter 203 and the n+ back surface field 204 of the IBC solar cell 205 of FIG. 1, though other designs or embodiments are possible. While only one second region 321 is illustrated in FIG. 6B, multiple second regions 321 may be used across a surface of the workpiece 300. Tails, such as those illustrated in FIG. 3, may be used or adjusted to form the second region 321 or space charge regions 324.

Figure 7:
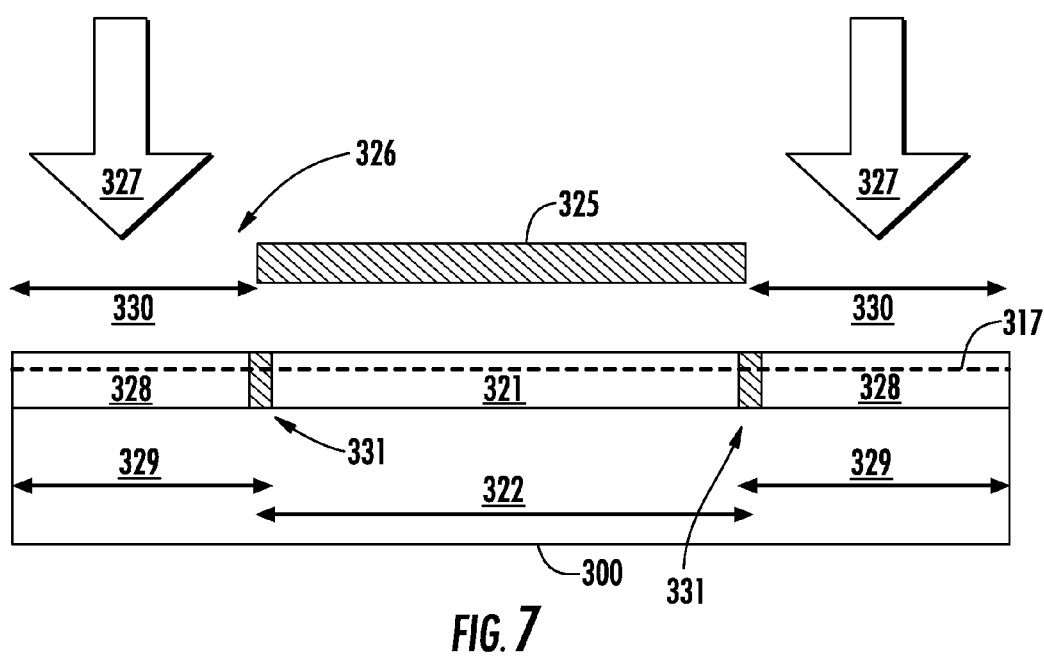
FIG. 7 is a cross-sectional side view of a third embodiment of implanting a workpiece.

FIG. 7 is a cross-sectional side view of a third embodiment of implanting a workpiece. In one embodiment, FIG. 7 is an additional step to the embodiment of FIGS. 6A-B. In FIG. 7, the workpiece 300 is implanted with a third species 327. The third species 327 may be the same as the first species 316 of FIG. 6A in one instance. The third species 327 is implanted through apertures 326 in the mask 325. This mask 325 may be a shadow mask or stencil mask and in this embodiment is illustrated upstream of the workpiece 300. The mask 325 blocks the third species 327 from implanting the workpiece 300 except through the apertures 326. The third species 327 and second species 320 have opposite conductivities in one embodiment, such that one is n-type and the other is p-type.

The third species 327 forms the third regions 328 in the workpiece 300. The third regions 328 are only a fraction of the surface of the workpiece 300 in this embodiment. The third regions 328 each have a center and a periphery at each end of the dimension 329. The dimension 329 of the third regions 328 is slightly larger than the dimension 330 of the apertures 326. This is partly due to the space charge of the third species 327 in the ion beam. While the third regions 328 are illustrated implanted deeper than the first region 317 (from the surface of the workpiece 300 to the dashed line), the third regions 328 also may be shallower or approximately the same depth as the first region 317. The third regions 328 may be implanted to the approximately same depth or a different depth than the second region 321.

The second region 321 and third region 328 both may have a dose gradient or profile such that each has a larger dose in the center than at the periphery. The periphery of the second region 321 and periphery of the third regions 328 overlap in FIG. 7. The overlap regions 331, which are shaded in FIG. 7, contain both n-type and p-type species and form a junction. In one instance the second region 321 and third region 328 of FIG. 7 may be the p+ emitter 203 and the n+ back surface field 204 of the IBC solar cell 205 of FIG. 1, though other designs or embodiments are possible. While only one second region 321 is illustrated in FIG. 7, multiple second regions 321 and third regions 328 may be used across a surface of the workpiece 300.

While a certain number of regions were illustrated in FIGS. 5A-B, 6A-B, and 7, this is for simplicity. Some workpieces have many more implanted regions across a surface. For example, these implanted regions may be between approximately 450 µm to 1450 µm. Thus, the embodiments illustrated may be repeated across some or all of a surface of a workpiece. In one embodiment, a solar cell contains a plurality of implanted regions across an entire surface. Furthermore, the dose gradient or profile disclosed in FIGS. 5A-B, 6A-B, and 7 may vary. For example, the dose may continuously decrease from the center to the periphery. Of course, other dose gradients or profiles are possible. In one particular embodiment, the center has a dose of 1E15 $cm^{-2}$ to 3E15 $cm^{-2}$ and the periphery has a dose of 1E13 $cm^{-2}$ to 1E14 $cm^{-2}$. Different doses in the center or periphery are possible if shunts are prevented.

Figure 8:
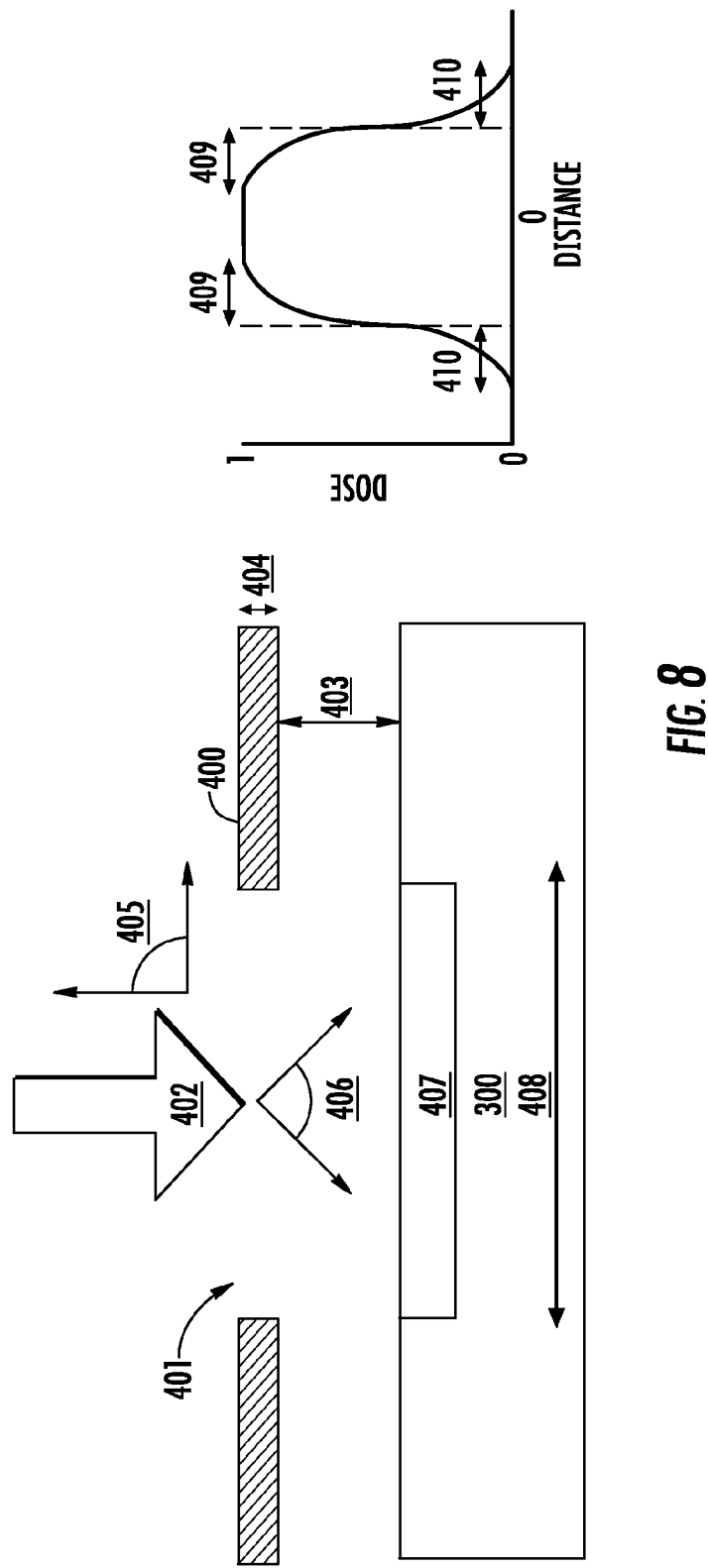
FIG. 8 is a cross-sectional side view of implanting through a mask.

There are many ways to achieve or adjust a lightly-doped tail or periphery of an implanted region. FIG. 8 is a cross-sectional side view of implanting through a mask. In this embodiment, the species 402 is implanted through the aperture 401 of the mask 400. This mask 400 may be a shadow mask or stencil mask and in this embodiment is illustrated upstream of the workpiece 300. The mask 400 blocks the first species 402 from implanting the workpiece 300 except through the aperture 401. The implanted region 407 has a center and a periphery at each end of the dimension 408. The implanted region 407 may have a dose gradient or profile such that it has a larger dose in the center than at the periphery. The tails 410 illustrated in FIG. 8 may contribute to the smaller dose at the periphery.

First, the dimension 403 between the mask 400 and the workpiece 300 affects the size of any shoulders 409 or tails 410 implanted in the workpiece 300. The dimension 403 may be increased until the spread of the species 402 in the ion beam increases and the larger dose region in the center of the implanted region 407 decreases. For example, if dimension 408 is approximately 500 μm, the dimension 403 may be approximately 2-10 mm for an ion beam of species 402 having a beam spread of about one degree.

Second, the dimension 404 of the mask 400 affects the size of any shoulders 409 or tails 410 implanted into the workpiece 300. This dimension 404 may be minimized to broaden the tails 410 and narrow the shoulders 409 or larger dose region in the center of the implanted region 407.

Third, the angle 405 between the ion beam of species 402 and the mask 400 affects the size of any tails 410. In FIG. 8, the angle 405 is about 90°. A smaller angle 405 enables a wider tail 410 to be implanted into the workpiece 300. However, only one tail 410 on one side of the shoulder 409 or the larger dose region in the center of the implanted region 407 will be increased by making the angle 405 smaller than 90°.

Fourth, the angle 406 representing the beam spread of the ion beam of species 402 affects the size of any tails 410. This angle 406 can be adjusted such that beam current implanting the workpiece 300 at angles far from the mean are increased. An optical lens, such as a deceleration lens, may be used to focus or spread the ion beam. Space charge in the ion beam of species 402 also affects the angle 406.

In one embodiment, a desired dose at the periphery of the implanted region 407 or other implanted regions in the workpiece 300 is determined. The dimension 403 is adjusted so that the desired dose is implanted into the workpiece. In another embodiment, the angle 405 is adjusted. This may change the angle between the ion beam of species 402 and the surface of the workpiece 300. Thus, the implant may not be performed perpendicular to this surface of the workpiece 300. In yet another embodiment, the angle distribution of the ion beam of species 402 (such as angle 406) or other ion beams or species is adjusted. This may provide a desired dose. Of course, other dimensions also can be changed to obtain the desired dose. Such changes will affect the lateral dose profile formed by the implant.

In an alternate embodiment, the ion beam of species 402 or other ion beams or species may be focused. The optics can be adjusted so that the ion beam of the species 402 or other ion beams or species has tails of the desired shape. For example, the voltage, plasma sheath shape, or distance between the plasma sheath and the workpiece can be adjusted. The bias to a focusing element or lens also can be changed. Focusing of an ion beam may occur with or without a stencil or shadow mask.

In yet another embodiment, a plasma system that modifies a plasma sheath may be used. Such a system can be enabled to form a profile with broad tails. Changing the shape of the plasma sheath will affect the angle spread of the ion beam of the species 402 or other ion beams or species.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting a workpiece comprising:
   implanting said workpiece with an n-type dopant in a first region, said first region having a center and a periphery; and
   implanting said workpiece with a p-type dopant in a second region complementary to said first region, said second region having a center and a periphery, wherein said periphery of said first region and said periphery of said second region at least partially overlap and wherein a dose at said periphery of said first region is less than a dose at said center of said first region and a dose at said periphery of said second region is less than a dose at said center of said second region.

2. The method of claim 1, wherein said workpiece is a solar cell.

3. The method of claim 1, wherein said implanting said n-type dopant and said p-type dopant each comprises implanting through a mask disposed a distance from said workpiece, said mask defining at least one aperture.

4. The method of claim 3, further comprising determining a desired dose at said periphery of said first region and said periphery of said second region, and further comprising adjusting a distance between said mask and said workpiece to implant said desired dose at said periphery of said first region and said periphery of said second region.

5. The method of claim 1, wherein at least one of said implanting said n-type dopant and said p-type dopant comprises focusing said n-type dopant and said p-type dopant during said implanting.

6. The method of claim 1, wherein at least one of said implanting with said p-type dopant and said implanting with said n-type dopant is performed at an angle with respect to a surface of said workpiece.

7. The method of claim 1, further comprising adjusting an angle distribution of at least one of said n-type dopant and said p-type dopant, said adjusting configured to change a lateral dose profile for said first region or said second region.

8. The method of claim 1, further comprising implanting said workpiece with either an n-type dopant or a p-type dopant to form a third region, said third region encompassing said first region and said second region, said first region and said second region extending to a depth deeper than said third region.

* * * * *